United States Patent [19]
Langley

[11] Patent Number: 5,376,235
[45] Date of Patent: Dec. 27, 1994

[54] METHOD TO ELIMINATE CORROSION IN CONDUCTIVE ELEMENTS

[75] Inventor: Rodney C. Langley, Boise, Id.

[73] Assignee: Micron Semiconductor, Inc., Boise, Id.

[21] Appl. No.: 91,542

[22] Filed: Jul. 15, 1993

[51] Int. Cl.⁵ .............................. H01L 21/00
[52] U.S. Cl. ......................... 156/664; 156/665; 156/666; 156/638; 156/651; 156/667; 252/79.1
[58] Field of Search .............. 156/643, 664, 665, 666, 156/662, 638, 651, 667; 252/79.1; 134/41

[56] References Cited

U.S. PATENT DOCUMENTS

| | | | |
|---|---|---|---|
| 4,432,846 | 2/1984 | Honeycutt, III | 134/3 |
| 4,824,757 | 4/1989 | Aono et al. | 430/169 |
| 4,999,160 | 3/1991 | Lowrey et al. | 420/529 |
| 5,007,981 | 4/1991 | Kawasaki et al. | 156/643 |
| 5,112,743 | 5/1992 | Kamiya et al. | 430/175 |

OTHER PUBLICATIONS

Freiberger et al., "A Novel Via Failure Mechanism in an Al–Cu/Ti Double Level Metal System", 1992, pp. 356–360.

Primary Examiner—R. Bruce Breneman
Assistant Examiner—George Goudreau
Attorney, Agent, or Firm—Lia M. Pappas

[57] ABSTRACT

A semiconductor wafer is washed in a dilute phosphoric acid solution after the metal features have been patterned and etched, thereby removing substantially all of the residual oxide, chlorine, and/or fluorine contamination which remains on the features. This will substantially eliminate corrosion of the features. The phosphoric acid wash also substantially prevents voids from forming during a subsequent alloy step. The features can include bond pads, vias, contacts, interconnects, etc.

18 Claims, 3 Drawing Sheets

METHOD TO ELIMINATE CORROSION IN CONDUCTIVE ELEMENTS

FIELD OF THE INVENTION

This invention relates to semiconductor manufacturing, and more particularly to minimizing pitting during a metallization process, especially useful when fabricating conductive features.

BACKGROUND OF THE INVENTION

When fabricating conductive features in a semiconductor, a chlorine (Cl) residue may remain on the surfaces of the metal stacks from which the features are formed, as illustrated in FIGS. 1 and 1a. As a result, voids or pits in the feature tend to result upon processing the metal through a heat step, such as an alloy step. The pitting has been especially noticeable in metal layers comprising titanium, for example, an aluminum (Al), titanium (Ti), and copper (Cu) stack. Such a stack may be used in the fabrication of metal interconnects, buses, vias, etc. This problem has been described in "A Novel Via Failure Mechanism in an Al-Cu/Ti Double Metal Level System," by Freiberger and Wu.

Current approaches to the above stated problem involve the use of a chromic phosphoric acid solution on the metal surfaces. While this material is somewhat effective in solving the problem, chromic phosphoric acid is highly carcinogenic, and therefore requires special handling during use and disposal. Thus, alternative solutions are being sought by the industry.

Another problem exists with regard to metallization process in bond pad formation. Aluminum is a metal with a very high chemical reactivity. Unfortunately, certain oxide layers interfere with the efficient functioning of the semiconductor device.

During the metal patterning step the aluminum bond pads are defined and etched. Subsequently, a passivation layer is deposited on the device to protect the device throughout the testing and packaging processes. However, the protective layer is first removed from the conductive bond pads through a pad mask patterning step. The pad mask step is typically done in a plasma or dry etch chamber.

After a semiconductor device has undergone the pad mask step, residual fluorine may remain on the bond pads from the etch chemicals, for example $CHF_3$, used in the process. This fluorine residue causes a condition referred to as "gummy pads" which is characterized by an adhesive-like oxide substance remaining on the bond pads (as illustrated in FIG. 5), which substance clings to the probe tips during die testing.

The "gummy bond pads" arise because the silicon nitride layer superjacent the aluminum bond pads is typically overetched. Fluorine (F) from the etch process is deposited onto the aluminum of the bond pads, producing an $AlFO_3$ oxide layer on the bond pads. The fluorine acts as an oxidizing agent which creates a greater than normal layer of oxide, thereby resulting in high resistivity, and consequently, low yields when probed.

SUMMARY OF THE INVENTION

In one embodiment, the process of the present invention employs a wet chemical process to remove chlorine from the resulting metal features after the metallization layers have been defined and dry etched, and the resist layer has been stripped. The wet chemical process of the present invention also functions to passivate the metal features. Subsequently, these metal features will undergo an alloy step.

The process of the present invention employs a 20:1 deionized water:phosphoric acid solution to the metal surfaces subsequent to the stripping of the photoresist layer, thereby substantially alleviating the classic formation of corrosion which occurs after the alloy step.

In an alternative embodiment, the wet chemical etch process of the present invention is performed after the bond pads of a semiconductor device have undergone the pad mask step, in order to remove the residual fluorine which may remain on the bond pads from the previous etch process.

The dilute phosphoric acid process of the present invention has been found to be effective in removing the residue, thereby substantially overcoming the "gummy" bond pad problem as well.

One advantage of the process of the present invention is that a solution containing deionized water and phosphoric acid is not carcinogenic, and therefore does not require the special handling and disposal associated with carcinogens.

A further advantage of phosphoric acid is its low cost and commercial availability, thereby making the process of the present invention more economical to use.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

The process of the present invention is useful when etching conductive layers to form metal features, for example, bond pads, interconnects, contacts, vias, buses, metal runners, etc. These features are fabricated from a variety of conductive materials, including but not limited to: aluminum (Al), titanium (Ti), Molybdenum (Mo), palladium (Pd), Copper (Cu), silicon (Si), and titanium nitride (TIN). It is to be understood that the embodiments shown and described are merely illustrative, and that the process of the present invention is useful when fabricating, passivating, or cleaning a variety of conductive features.

Figure 2:
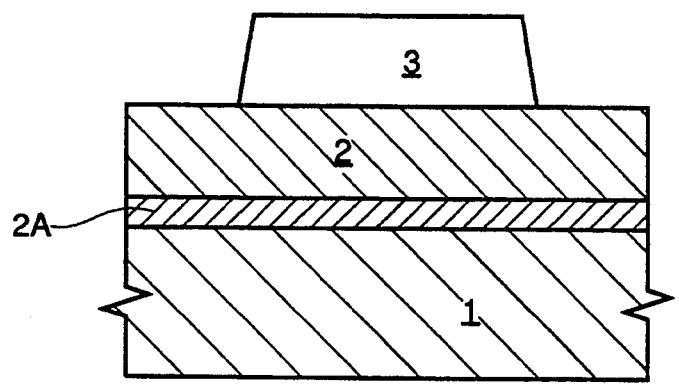
FIG. 2 is a schematic cross section of a metallization scheme which has been patterned with a resist layer.

In the metalization process of forming conductive features, a conductive metallic layer 2, 2A is deposited preferably by sputtering, or other suitable method, onto the superjacent a semiconductor wafer 1. In the illustrative embodiment of FIG. 2, the layers 2, 2A are comprised of aluminum-5% copper, and titanium, and are preferably sputter deposited to a thickness of approximately 10 kÅ and 1000 Å, respectively. The wafer 1 is then patterned with a resist layer 3, preferably a dyed metal resist 3.

The conductive metallic layer 2, 2A is then patterned and etched together, by any of the methods known in the art, such as for example, a masked photoresist 3 followed by a dry or plasma.

Figure 3:
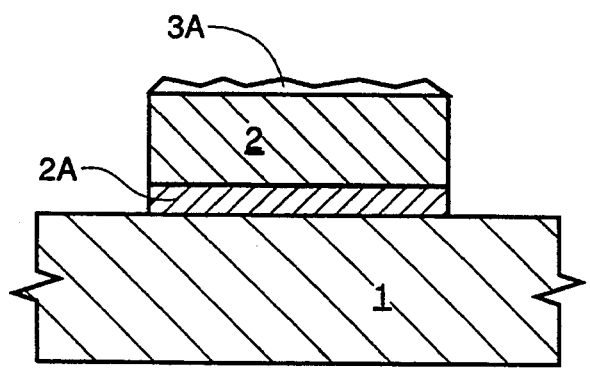
FIG. 3 is a schematic cross section of a conductive feature formed from the metallization scheme of FIG. 2, also showing a residue.

FIG. 3 illustrates the metal features 2 after they have been etched. The conductive layers 2, 2A can be etched with any chlorine containing etch chemistry known in the art, for example, $BCl_3$, $Cl_2$, $N_2$, and $NF_3$. Alternatively, boron trifluoride ($BF_3$), and silicon tetrafluoride ($SiF_4$) can be substituted for the nitrogen trifluoride ($NF_3$) in the above combination of etchants. Other alternatives include: chlorotrifluoro-silane ($SiClF_3$), dichloro-difluoro-silane ($SiCl_2F_2$) and chloro-trifluoro-silane ($SiClF_3$). The etch is frequently a substantially anisotropic etch. An over etch may be done with a chemistry of $BCl_3$, $Cl_2$, $N_2$, and Ar.

Figure 1:
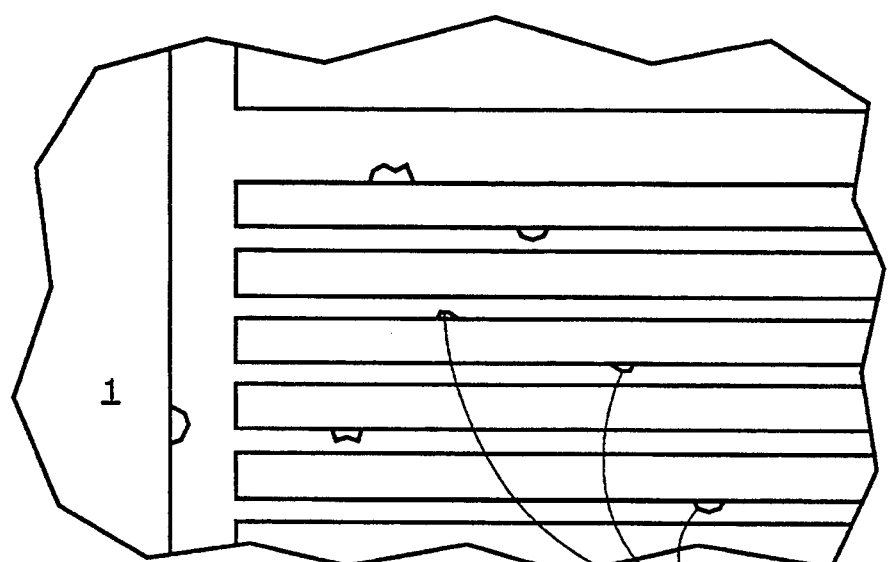
FIG. 1 is a schematic top view of a conductive feature after an alloy step has been performed, showing the voids or pits.
Figure 1A:
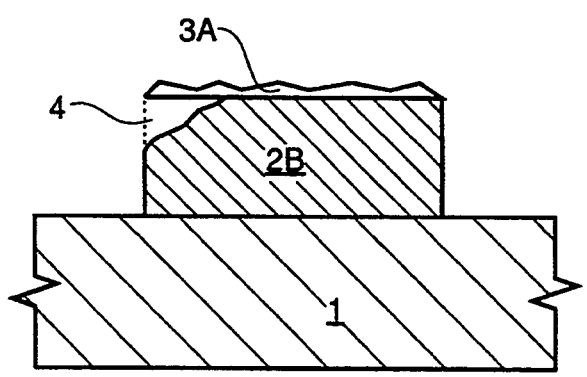
FIG. 1a is a schematic cross section of the feature of FIG. 1, also showing a "skin" which results from the presence of a residue on the feature before the feature underwent an alloy step.

Referring to FIGS. 1 and 1a, a problem associated with the fabrication of metal or conductive structures 2B is illustrated. Once a feature is etched into the conductive layer 2, 2A, and the photoresist layer 3 is removed (or stripped), a heat step, referred to as an "alloy," is often performed. If a residue 3 or a contaminant remains on the metal feature 2B, a void or pit 4 tends to form during the heat process, representing a form of corrosion.

The observed voids 4 have a characteristic appearance, in that a "skin" 3A covers the corroded area. The "skin" 3A is believed to be caused by residue 3 left on the conductive features 2B or driven into the surface of the metal. The residue 3A reacts at high temperatures to consume or corrode the metal features 2B, but chlorinated carbon compounds 3 remain, which chlorinated carbon compounds 3 result in the characteristic "skin" 3A.

The activation heat required for the formation of voids 4 appears to be at temperatures greater than 300° C. When alloying steps using temperatures in excess of 350° C. are performed, large voids 4 tend to appear in a random pattern on metal geometries 2, 2B.

Figure 4:
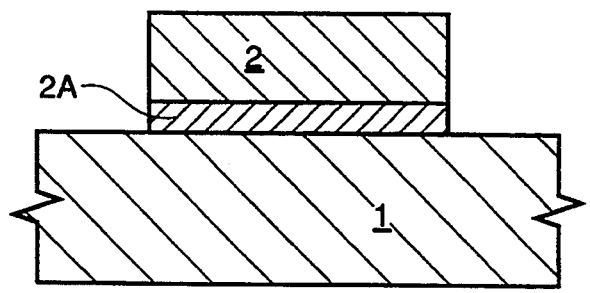
FIG. 4 is a schematic cross section of the feature of FIG. 3 after undergoing the process of the present invention.

Through the use of the 20:1 phosphoric acid solution dip of the process of the present invention, the voids 4 are substantially eliminated in alloying steps up to approximately 425° C., as shown in FIG. 4. Beyond 500° C., the alloy step begins to vaporize the metal feature as well. With the dramatic reduction in chlorine, there is no reaction of the chlorine with the aluminum-titanium-copper metal stack during the subsequent heating step involved in alloying the metal stack 2, 2A. This reaction is a consumption of non-specific areas on metal runners.

This extremely light phosphoric acid etch substantially removes the chlorine or other contaminants 3 that reside after the photoresist stripping process, which stripping process follows the chlorine metal etch.

Figure 5:
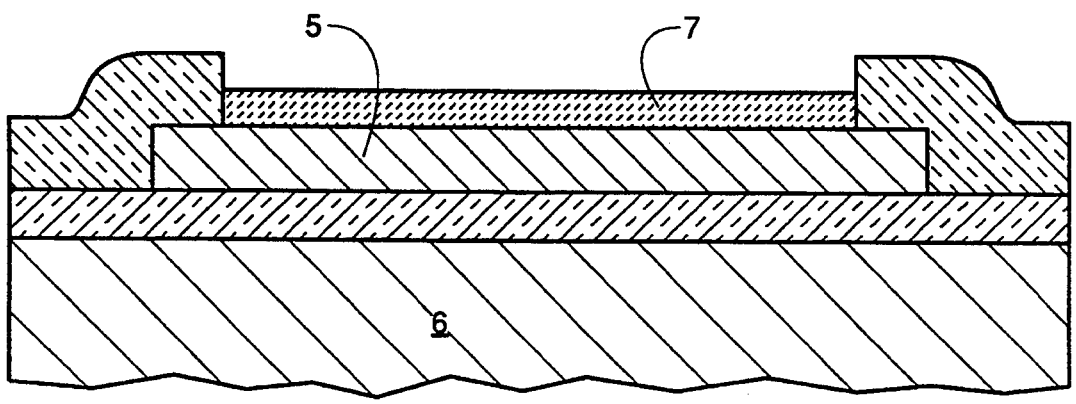
FIG. 5 is a schematic cross section of a bond pad having an oxide layer disposed thereon.
Figure 6:
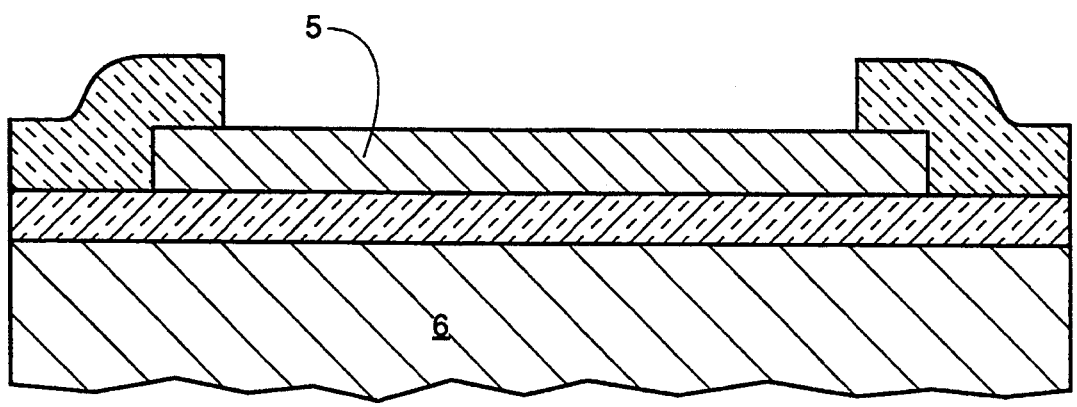
FIG. 6 is a schematic cross section of the bond pad of FIG. 5, after the oxide layer was removed by the process of the present invention.

Referring to FIG. 5, a problem experienced in manufacturing reliable bond pads 5 is shown. A conductive bond pad 5 comprised for example of a metal, such as aluminum, or a metal alloy, is disposed on a substrate 6 on which has been grown or deposited an oxide layer 7 of a semiconductor device. The conductive pad 5 can be oxidized when exposed to atmospheric oxygen, or in some cases, moisture, thereby forming an insulating layer 7.

The semiconductor device is typically, passivated with a layer of silicon dioxide and $SiN_3O$. The passivation layer is then removed from the bond pad or other metal areas by an etch process. Typically, the etch process is a dry/plasma etch, and is performed in fluorine containing gases, such as $CHF_3$. Other gases may be used such as, $CF_4$, $C_2F_6$, $C_2F_2$, $C_4F_8$, etc. These fluorine-containing gases frequently leave a residue 7 on the bond pad 5.

Hence, prior to the formation of the interconnect (not shown), a source of contamination (and possible failure) is already present in the device. The presence of fluorine in the oxide layer exacerbates the problem further by causing the pad to become highly resistive. This results in the wafer being "gummy", referring to the fluoride oxide which collects on the probe tips.

Removal of the residual fluorine oxide layer 7 significantly increases the reliability of the device by limiting the opportunities for corrosion, and hence protecting the integrity, of the bond pad 5 or other conductive feature.

To solve both of the above described problems, the process of the present invention employs a very dilute mixture of deionized water and phosphoric acid to very lightly etch the aluminum with substantially no adverse affect to the metal profile or the critical dimension.

Other embodiments of the process solution should contain phosphorous. An alternative to deionized water is potassium nitrate. Heavy metals, such as chromic phosphoric may also be effective, but they are not as commercially feasible.

There is a wide process window for the process of the present invention. The preferred embodiment of the invention employs a solution of deionized water and phosphoric acid in a ratio of 20:1. In this proportion the solution only consumes 0.02 $\mu m$ of metal in all directions. However, solutions in the approximate range of 10:1 to 50:1 can be used.

The preferred temperature of the solution is substantially within the range of 40° C. to 60° C. At temperatures below 20° C., the phosphoric acid solution did not effectively remove the residual films, and at temperatures above 60° C., the phosphoric acid solution began to etch the metal feature as well. Process times are adjusted to the amount of dilution, mixture, and temperature. However, the reaction may become difficult to control and repeat outside of the preferred parameter ranges.

While the particular wet etch process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the process can be used effectively on a variety of metal features comprised of a variety of conductive materials, especially those metal stacks comprising titanium.

What is claimed is:

1. A method for eliminating corrosion on metal features, said method comprising the following steps of:

etching a metal feature with a phosphoric acid solution, said metal feature being disposed on a semiconductor substrate, wherein said phosphoric acid solution does not contain chromic acid, said phosphoric acid solution comprises deionized water and phosphoric acid in the range a ratio of approximately 20:1.

2. The method according to claim 1, further comprising the following steps of:

patterning a conductive layer disposed on said semiconductor substrate; and selectively removing portions of said conductive layer, thereby defining said metal feature.

3. The method according to claim 2, wherein said metal feature comprises at least one of the features selected from the group comprising a contact, an interconnect, a bus, a via, and a bond pad.

4. The method according to claim 2, further comprising the following step of:

exposing said semiconductor substrate to a heat treatment.

5. The method according to claim 4, wherein said heat treatment is accomplished at a temperature in the range of 350°–450° C.

6. A process for passivating conductive features, said process comprising the following steps of:

fabricating said conductive features comprising at least one metallic layer; and dipping said conductive features in an aqueous phosphoric solution which does not contain chromic acid.

7. The process according to claim 6, wherein said conductive features comprise a metal stack, said metal stack comprising a reflective film.

8. A method for creating metal features, said method comprising the following step of:

disposing a conductive layer superjacent a semiconductor substrate;

patterning a mask layer superjacent said conductive layer;

etching said conductive layer, thereby defining said metal features;

removing said mask layer; and washing said substrate in a cleansing solution, wherein said cleansing solution comprises phosphoric acid.

9. The method according to claim 8, wherein said cleansing solution further comprises at least one of deionized water and potassium nitrate.

10. The method according to claim 9, wherein said cleansing solution comprises said deionized water and said phosphoric acid in an approximate ratio of 10:1 to 50:1, at a temperature in the approximate range of 40° C. to 60° C.

11. The method according to claim 10, wherein said metal feature comprises at least one of the features of the group comprising a bond pad, an interconnect, a via, a contact, and a bus.

12. The method according to claim 11, further comprising the step of:

passivating said metal feature prior to removing said mask layer.

13. The method according to claim 11, further comprising the step of:

heating the substrate, thereby alloying said metallic feature.

14. The method according to claim 13, wherein said substrate is heated to a temperature less than 500° C.

15. The process according to claim 6, wherein said conductive features comprise at least one of the materials selected from the group consisting of Al, Ti, Cu, TiN, Si, Mo, Cr, and Pd.

16. The process according to claim 15, wherein said solution comprises water and phosphoric acid in a ratio in the range of 10:1 to 50:1.

17. The process according to claim 16, wherein said solution is at a temperature in the range of 40° C. to 60° C.

18. The process according to claim 17, wherein said phosphoric acid removes fluorine, chlorine, and oxide residues from said conductive features.

* * * * *